United States Patent [19]
Edelstein et al.

[11] Patent Number: 5,796,074
[45] Date of Patent: Aug. 18, 1998

[54] WAFER HEATER ASSEMBLY

[75] Inventors: Sergio Edelstein, Los Gatos; Steven A. Chen, Fremont; Vijay D. Parkhe, Sunnyvale, all of Calif.

[73] Assignee: Applied Materials, Inc., Santa Clara, Calif.

[21] Appl. No.: 565,185

[22] Filed: Nov. 28, 1995

[51] Int. Cl.⁶ .................................................... F27B 5/14
[52] U.S. Cl. ................................................................ 219/390
[58] Field of Search ............................ 219/390, 618, 219/634, 638, 652; 118/724, 725, 728, 733; 427/255.6; 279/128

[56] References Cited

U.S. PATENT DOCUMENTS

| | | |
|---|---|---|
| 4,609,037 | 9/1986 | Wheeler et al. |
| 4,645,218 | 2/1987 | Ooshio et al. |
| 4,897,171 | 1/1990 | Ohmi . |
| 4,993,359 | 2/1991 | Lewis et al. |
| 5,113,929 | 5/1992 | Nakagawa et al. |
| 5,160,152 | 11/1992 | Toraguchi et al. ................ 279/128 |
| 5,221,403 | 6/1993 | Nozawa et al. |
| 5,224,999 | 7/1993 | Shiraiwa et al. |
| 5,250,137 | 10/1993 | Armi et al. |
| 5,275,683 | 1/1994 | Armi et al. |
| 5,290,381 | 3/1994 | Nozawa et al. |
| 5,314,573 | 5/1994 | Higuchi et al. |
| 5,344,492 | 9/1994 | Sato et al. |
| 5,356,476 | 10/1994 | Foster et al. |
| 5,368,648 | 11/1994 | Sekizuka . |
| 5,382,311 | 1/1995 | Ishikawa et al. |
| 5,383,971 | 1/1995 | Selbrede . |
| 5,411,076 | 5/1995 | Matsunaga et al. |
| 5,415,729 | 5/1995 | Strasser et al. |
| 5,431,737 | 7/1995 | Keller et al. |
| 5,467,220 | 11/1995 | Xu ................................... 359/350 |
| 5,525,780 | 6/1996 | Moslehi ........................... 219/618 |
| 5,538,758 | 7/1996 | Beach et al. ................... 427/255.6 |
| 5,575,856 | 11/1996 | Foster et al. .................... 118/733 |

FOREIGN PATENT DOCUMENTS 89-327830/45  3/1988  Japan .

OTHER PUBLICATIONS

P. Singer, "Electrostatis Chucks in Wafer Processing," *Semiconductor International*, p. 57 (Apr. 1995).

*Primary Examiner*—Adolf Berhane
*Attorney, Agent, or Firm*—Townsend and Townsend and Crew LLP

[57] ABSTRACT

A wafer heater assembly (8) for a deposition/etch chamber (2) includes a base (32) and a wafer support or chuck (36), having a wafer-chucking surface (76), spaced apart from the base by a circumferential barrier support (38). A heater sub-assembly (54) is mounted to the wafer support. Bolts (48) are used to secure the wafer support to the base with the barrier support therebetween to press the barrier support against an elastomeric O-ring, a metal V-seal or other fluid seal (46) positioned between the base and base end (42) of the barrier support. This eliminates the need to discard the entire heater assembly if the dielectric wafer-chucking surface becomes damaged. The temperature of the fluid seal is about 50°–70° C. lower than the temperature of the wafer-chucking surface when the wafer-chucking surface is about 200°–300° C.

21 Claims, 4 Drawing Sheets

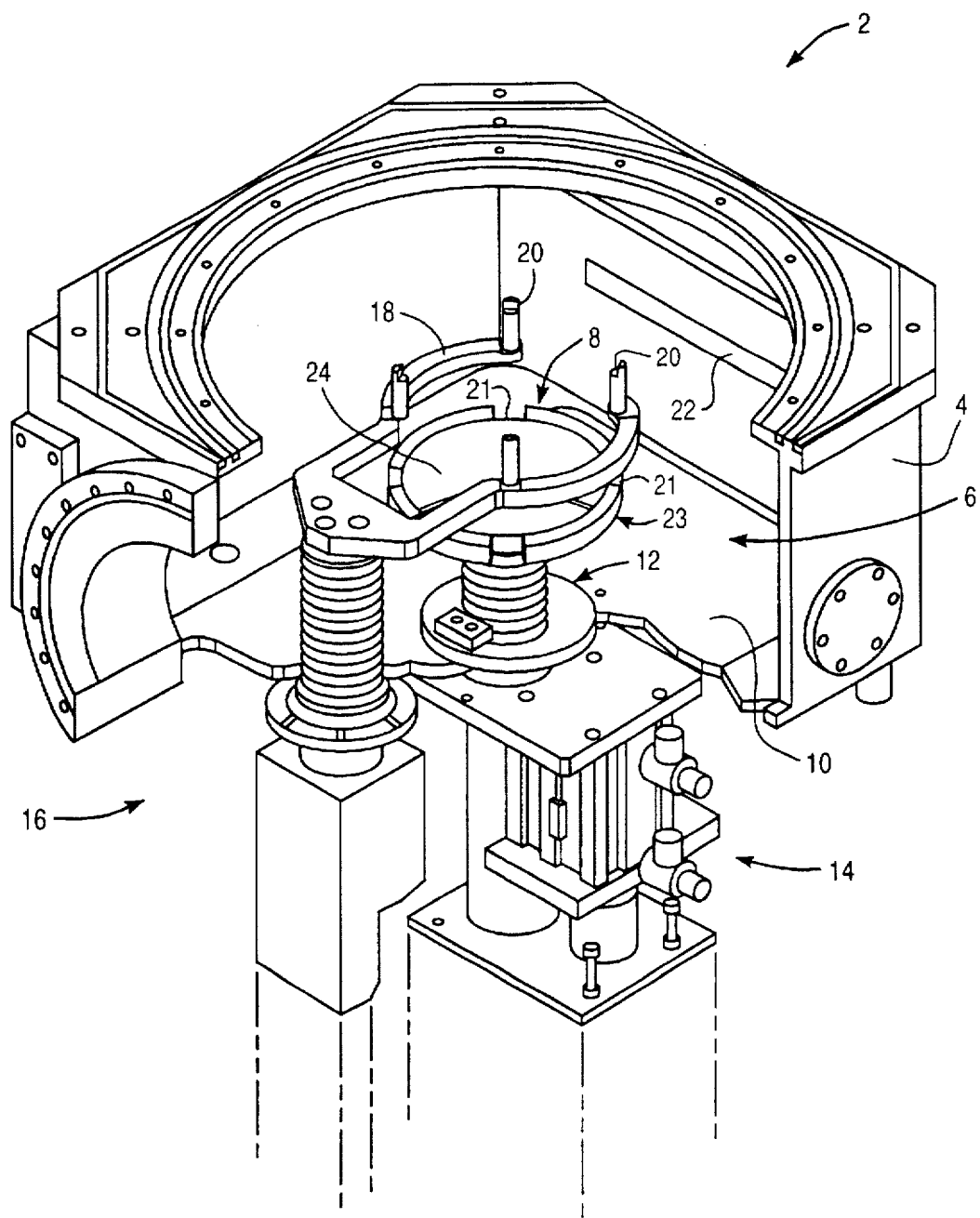
FIG_1 (PRIOR ART)

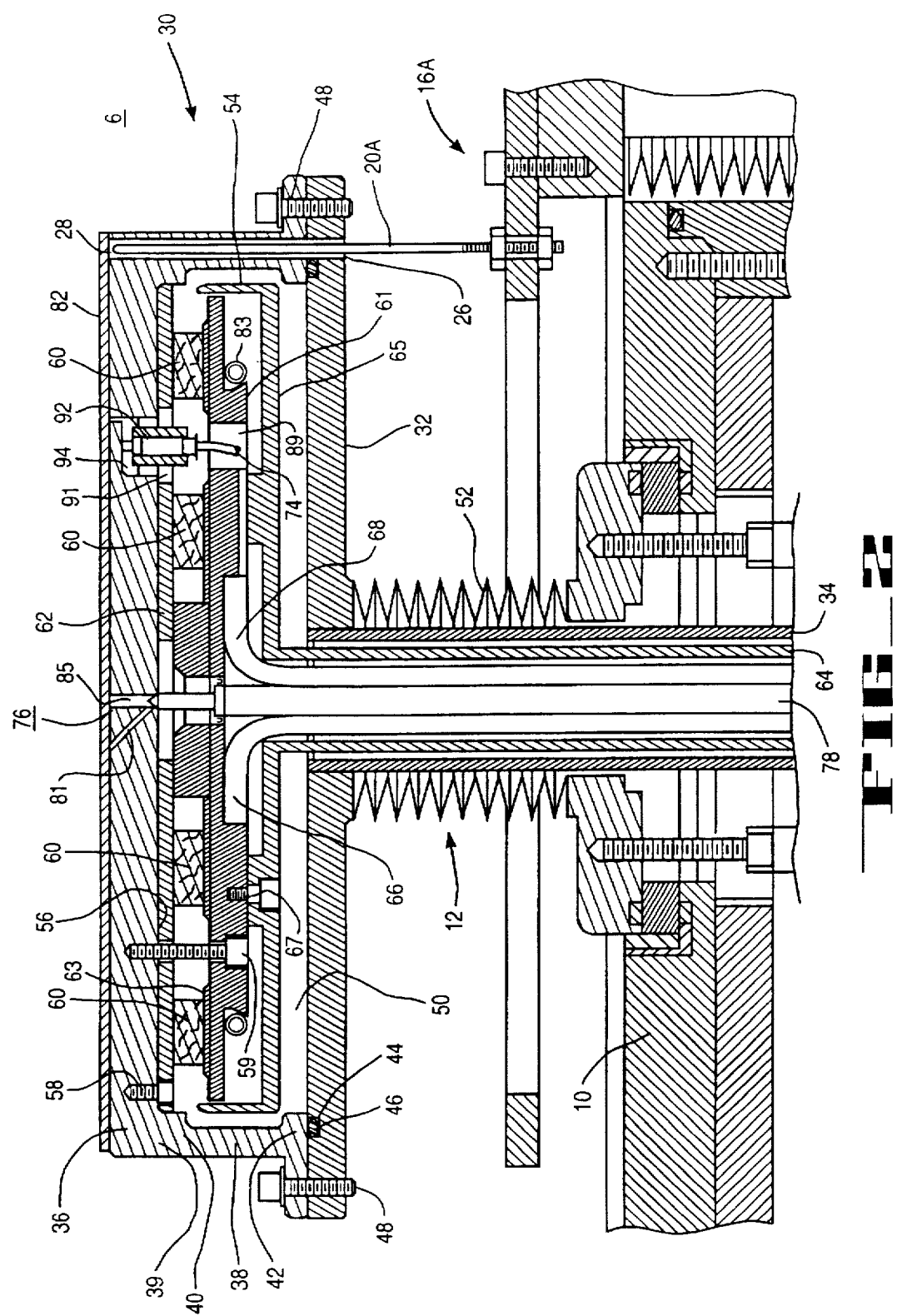
FIG_2

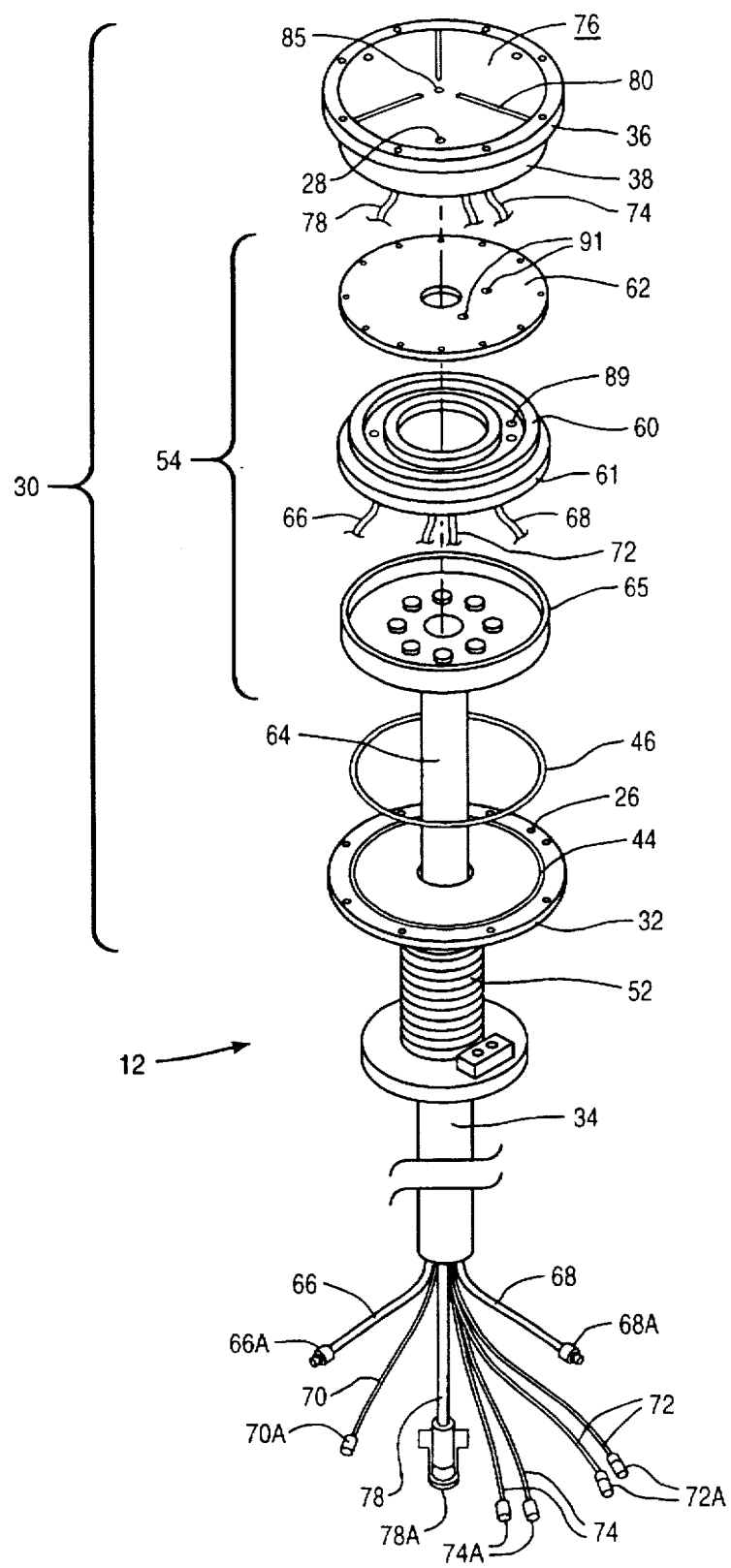
FIG_3

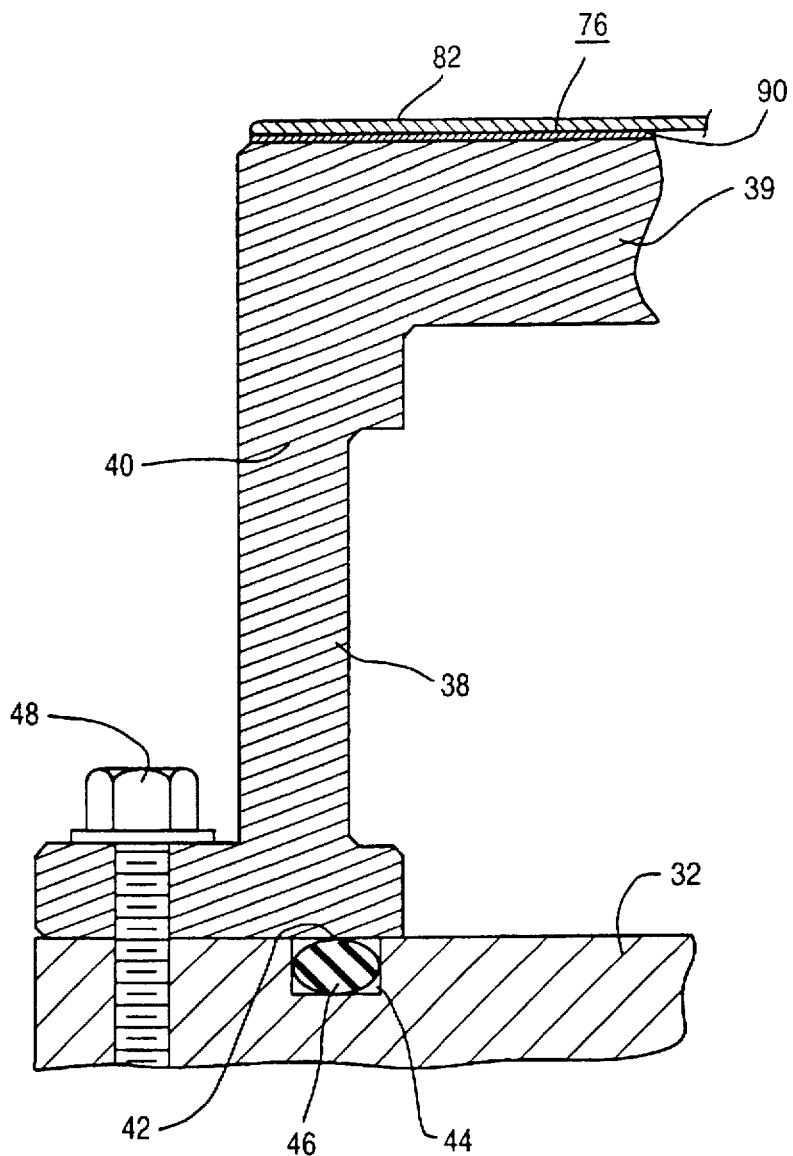
FIG_4

WAFER HEATER ASSEMBLY

BACKGROUND OF THE INVENTION

Physical vapor deposition (PVD), chemical vapor deposition (CVD) and etch chambers commonly use a heated wafer (or other substrate) support or pedestal, on which the wafer or other substrate is mounted, to enable control of substrate temperature during processing. To ensure predictable heat transfer between the wafer and the support, the wafer must be firmly, but releasably, mounted to the support. Heat is typically provided by the placement of an electric resistance wire heater in contact with the underside of the wafer support.

One conventional way of mounting wafers to the substrate support is through the use of a clamp ring which engages the periphery of the wafer and secures the wafer tightly against the chucking surface of the wafer support. Another type of wafer support is an electrostatic wafer support, also called an electrostatic chuck, which uses electrostatic forces to secure the wafer to the wafer support to eliminate the need for a clamp ring. Using electrostatic chucks permits the utilization of the full surface of the wafer for the formation of semiconductor devices since, in that case, clamping rings are not necessary to secure the wafer in place.

Electrostatic chucks are typically made with a wafer-chucking surface of three or more layers. The top layer and the bottom layer of the chuck are typically polyimide with a copper or other conductive layer sandwiched between. Other dielectric materials can also be used, especially for applications in which the temperatures are above about 300° C. For example, aluminum nitride can be used as the dielectric material for temperatures up to about 500°–600° C.

While the use of electrostatic chucks has several advantages, including lessening particle generation, eliminating bowing the wafer and increasing the available wafer surface for device fabrication, it also creates additional maintenance problems for the device fabricator. Conventional chucks, i.e., those which employ a clamp to attach the wafer to the support, are typically made of stainless steel or aluminum and require little maintenance. The wafer-chucking surfaces of electrostatic chucks, unlike the wafer-chucking surfaces of metal surface chucks, are much more susceptible to damage from the processing environment and have a limited life as a result. Even a small scratch on the insulating surface of an electrostatic chuck can damage the insulation surface sufficiently to create arcing which can destroy the chuck or the wafer or other substrate mounted to the chuck. Also, being a polymer material and being exposed to plasma gases, particularly argon and nitrogen based cleaning plasmas, result in a limited life for the wafer-chucking surface.

Conventional electrostatic chucks can be made in the same manner that non-electrostatic chucks are made. That is, the entire wafer heater assembly, i.e., both the substrate support and the heating assembly, can be made to constitute a single welded unit. If the wafer chucking surface of the electrostatic chuck becomes damaged, the only recourse is to remove the entire wafer heater assembly and replace it, a very expensive proposition. In addition, to repair or replace the wafer support or chuck of a conventional wafer heater assembly requires the removal of the entire wafer heater assembly. This job is awkward and difficult and typically takes several hours, thus making the job costly both in terms of effort expended and lost production time.

In response to these drawbacks, dielectric chucks have been manufactured with the uppermost layer of the wafer support being removably mounted to the remainder of the body of the wafer support. While this eliminates the need to replace the entire wafer heater assembly and heater assembly support, it adds an extra interface between the source of heat and the wafer chucking surface. This additional interface significantly increases the thermal resistance between the source of heat and the wafer chucking surface, requiring the source of heat to be hotter to create the same temperature at the wafer chucking surface. This not only increases the amount of energy required to reach the temperature, it also increases the temperature of the other components and puts increased load on cooling systems. In addition, much of the rigidity desired of the wafer support body needed to ensure that the wafer chucking surface remains in its desired, typically flat, state, is lost when the wafer support body is made of multiple layers.

SUMMARY OF THE INVENTION

The present invention is directed to a wafer heater assembly for a deposition/etch chamber which permits the wafer support portion thereof and the heater element, if desired, to be relatively easily removed from the chamber without requiring removal of the entire wafer heater assembly. This is made possible by: 1) designing the wafer heater assembly to be at least two separable parts, specifically a support and base within which a heating element is contained, joined by a fluid seal; and 2) choosing the fluid seal (elastomeric o-ring, metal v-seal, etc.) appropriate for the maximum temperature the fluid seal is exposed to. This enables technicians to replace or repair a defective wafer support in an efficient manner by removing the support while the base remains in place in the chamber. The need to discard the entire wafer heater assembly due to a damaged wafer chucking surface is therefore eliminated.

In the preferred embodiment of the present invention, the wafer heater assembly includes a base, a wafer support or chuck and a circumferential barrier support separating the two. The wafer support has a wafer-chucking surface. A heater sub-assembly is thermally coupled to the wafer support, and is preferably rigidly mounted to the wafer support, to provide the desired heating to the wafer-chucking surface. The circumferential barrier support is preferably a one-piece extension of the wafer support and has a lower or base end which engages the base of the assembly. A fluid seal, such as an O-ring or a V-seal, is positioned between the base end of the barrier support and the base of the assembly. User-accessible attachment elements, such as bolts, are used to secure the wafer support to the base with the barrier support therebetween to press the base end of the barrier support against the base with the fluid seal captured therebetween. This construction provides two features: A fluid-tight heater chamber within the wafer heater assembly within which the heater element is contained; and a thermal barrier, in the form of the barrier support, to the conductive transfer of heat from the wafer support to the fluid seal to keep the fluid seal from becoming overheated.

In one preferred embodiment the temperature of the fluid seal is about 50°–70° C. lower than the temperature of the wafer support surface when the temperature of the wafer support surface is about 200°–300° C. Conventional elastomeric O-rings, such as those made from Viton®, can be used up to temperatures of about 175° C. Metal v-seals made from nickel alloys, such as those manufactured by Parker Seal, can be used at temperatures of up to about 980° C. Polyimide electrostatic chucks have a temperature limit of about 300° C. but aluminum nitride electrostatic chucks have a temperature limit of about 500°–600° C. Therefore, the temperature of the dielectric material used and the particular fluid seal chosen will depend on the operating temperatures to be encountered.

In the preferred embodiment the lower portion of the heater subassembly, that is the side away from the wafer support, is cooled by circulating cooling water between the base and the heater elements, as is conventional. The circulation of cooling water within the heater sub-assembly permits the heater elements to heat the wafer support while limiting the radiant and convective heat transfer to the base and the fluid seal. This helps to maintain the temperature of the fluid seal at an acceptable level. In some situations it may be necessary or desirable to provide additional cooling for the fluid seal. This can be accomplished by flowing coolant through a cooling conduit adjacent to the fluid seal.

Another feature of the invention is the use of quick disconnects along the various lines, such as cooling water supply and return lines, a heater gas line, a thermocouple line and electrical power lines. These quick disconnect connectors could be positioned adjacent the heater sub-assembly mounted to the bottom of the wafer support but are more preferably positioned just below where the lines exit the chamber. In a preferred embodiment, the wafer support is easily removed by simply first disconnecting the various quick disconnects along the lines at a position beneath the chamber, removing several bolts mounting the combination of the wafer support and circumferential barrier support to the base of the wafer heater assembly, and then simply lifting the wafer support/circumferential barrier support, with the heater sub-assembly and associated lines attached thereto, from the base of the wafer heater assembly. The base of the wafer heater assembly remains within the chamber interior, supported above the chamber bottom by a movable support tube, the support tube typically being surround by a stainless steel bellows.

The circumferential barrier support is preferably designed using finite element analysis. Fluid seals made from elastomeric materials are usually preferred over metal and other higher-temperature seals when operating temperatures are sufficiently low because they provide a better seal and do not tend to create particles during assembly, both very important considerations in the high vacuum environment within a PVD chamber. It is therefore preferred that the temperature of the fluid seal be substantially lower, at least about 50° C. lower, than the temperature of the wafer support to permit the use of conventional elastomeric fluid seals even though the temperature of the support surface is up to about 50°-70° C. above the acceptable operating temperature of the elastomeric o-ring.

In the preferred embodiment the barrier support is a one-piece integral extension of the wafer support to eliminate a leakage path between the interior of the heater assembly and the interior of the PVD or CVD or etch chamber. In this way the only joint for potential leakage between the interiors of the chamber and the wafer heater assembly is at the fluid seal captured between the base end of the barrier support and the base of the heater assembly.

A primary advantage of the invention is that by making the wafer support or chuck separable from the base of the wafer heater assembly, the entire wafer heater assembly need not be discarded merely because support surface has become damaged, such as by being scratched, as is necessary with conventional welded electrostatic wafer heater assemblies. Also, when the heater elements are mounted directly to the wafer support and thus are removed with wafer support 36, they can be easily removed from the defective wafer support and reused. A further advantage of the invention is that when the wafer support must be removed, it eliminates the need to move or otherwise disturb the stainless steel bellows, the bellows acting as a fluid seal between the base of the heater assembly and the bottom of the chamber housing. This is important because these bellows are quite expensive and can be easily damaged if not handled properly.

Other features and advantages of the invention will appear from the following description in which the preferred embodiment has been set forth in detail in conjunction with the accompanying drawings.

BRIEF DESCRIPTION OF THE DRAWINGS

FIG. 1 is a somewhat simplified isometric view of a conventional PVD chamber with portions broken away to show interior components;

FIG. 2 is a side cross-sectional view of a wafer heater assembly made according to the invention;

FIG. 3 is an exploded isometric view of the wafer heater assembly of FIG. 2 and a heater assembly support; and FIG. 4 is an enlarged cross-sectional view of a portion of the body of the wafer support and the circumferential barrier support.

DESCRIPTION OF THE PREFERRED EMBODIMENT

FIG. 1 illustrates, in simplified form, a conventional PVD chamber 2 including a PVD chamber housing 4 defining a PVD chamber interior 6. A wafer heater assembly 8 is supported above the bottom 10 of housing 4 by a heater assembly support 12. A heater lift assembly 14 is positioned beneath bottom 10 of housing 4 and acts through heater assembly support 12 to raise and lower heater assembly 8. A wafer lift assembly 16 is supported by bottom 10 of housing 4 and includes a pair of wafer lift arms 18 positioned within interior 6 aligned with wafer heater assembly 8. Each arm 18 has a pair of notched supports 20 sized and positioned to support a wafer, not shown in FIG. 1, introduced into interior 6 through a slit valve 22. Supports 20 are aligned with notches 21 formed in wafer support or chuck 23. After the wafer is positioned on the upper ends of supports 20, a robot blade (not shown) supporting the wafer is then drawn back through slit valve 22 allowing arms 18 to be lowered placing the wafer on the wafer support surface 24 of wafer support 23, also called the wafer-chucking surface 24, of the heater assembly 8. The wafer is secured to wafer support surface 24 by either the use of a clamp ring (not shown) or, if the wafer support surface 24 is a support surface of a dielectric chuck, by electrostatic forces.

FIGS. 2 and 3 illustrate a wafer heater assembly 30 made according to the invention. Many of the components of wafer heater assembly 30 are substantially the same as those conventional components discussed with reference to FIG. 1. Like parts will be referred to with like reference numerals and will not be discussed in detail.

Wafer heater assembly 30 comprises a base 32 mounted above bottom 10 by a support tube 34, the support tube being raised and lowered by heater lift assembly 14 (shown only in FIG. 1). Wafer heater assembly 30 also includes a wafer support or chuck 36 separated from base 32 by a circumferential barrier support 38. (See FIG. 4.) Barrier support 38 is a one-piece generally cylindrical extension of the body 39 of wafer support 36. Barrier support 38 has a wafer end 40 adjacent to body 39 and a base end 42 adjacent to base 32.

Base 32, body 39 and barrier support 38 are all preferably made of stainless steel.

Wafer lift assembly 16A is configured somewhat differently from assembly 16 of FIG. 1. Assembly 16A has three ceramic wafer lift pins 20A which pass through holes 26, 28 formed through base 32 and through supports 36, 38, respectively. Lift pins 20A are made of non-electrically conductive ceramic material to prevent an electrical path from being created between a wafer 82 and wafer heater assembly 30.

Base 32 has a circular groove 44 housing a fluid seal 46 therein. See FIG. 6. The fluid seal is typically an O-ring and is preferably made of Viton® or some other elastomeric sealing material capable of withstanding relatively high temperatures, such as 100° C. to 175° C., with chamber interior 6 under high vacuum conditions, such as $10^{-9}$ torr. Thus, with such an elastomeric o-ring, the maximum temperature which can be used for wafer support is about 225°–245° C. based on a temperature drop to base end 42 of about 50°–70° C. If higher temperatures are to be encountered by seal 46, a v-seal, such as nickel alloy v-seals available from Parker Seal of Derea, Conn. can be used. Circumferential groove 44 is positioned to lie beneath base end 42 so that with wafer support 36 secured to base 32 by bolts 48, a high quality fluid seal is created between the interior 6 of PVD chamber 2 and a heater chamber 50 defined by wafer support 36, barrier support 38 and base 32.

A stainless steel bellows 52 is used surrounding guide tube 64 and is secured at its ends to base 32 and bottom 10. Bellows 52 ensures that a fluid-tight seal is maintained between base 32 of assembly 30 and bottom 10 of chamber 2 as assembly 30 is raised and lowered by heater lift assembly 14.

Wafer heater assembly 30 includes a heater sub-assembly 54 mounted to the lower, heater surface 56 of wafer support 36 using screws 58, 59. Screws 58 are used to secure a copper heat distribution plate 62 to surface 56. Screws 59 are used to mount an intermediate support plate 61, typically made of stainless steel, to body 39 of wafer support 36. Heater sub-assembly 54 also includes a pair of concentric electrical resistance heater elements 60 captured between support plate 61 and heat distribution plate 62. Heater sub-assembly 54 further includes a bottom member 65 secured to support plate 61 by eight screws 67.

A guide tube 64 extends from bottom member 65 of sub-assembly 54. Guide tube 64 fits within support tube 34 and guides a number of lines extending from wafer heater assembly 30. Specifically, guide tube 64 guides water supply and return lines 66, 68 (see FIG. 3) used to cool the lower portions of heater sub-assembly 54, a thermocouple line 70 used to monitor the temperature of wafer support 36, electric heater power lines 72 used to supply electrical energy to heater elements 60, electrostatic power lines 74 used to provide an electrostatic charge to the electrostatic wafer-chucking surface 76 of wafer support 36 as is discussed below, and a heater gas line 78. Gas line 78 is coupled to three angled conduits 81, formed in the body 39 of wafer support 36, to provide shallow grooves 80, see FIG. 3, formed on wafer-chucking surface 76 with a small amount of heat-conductive gas, such as argon, to ensure good heat transmission from surface 76 to a wafer 82.

Water lines 66, 68 are connected to a cooling water conduit 83 mounted to support plate 61. Passage of water through supply line 66, through conduit 83 and out of return line 68 helps to cool support plate 61 and thus reduce the transfer of heat to fluid seal 46.

Body 39 of wafer support 36 includes a vertical bore through its center housing a glass pin 85. This permits monitoring of the temperature of wafer 82 using optical methods, as is conventional.

Wafer chucking surface 76 is, in this preferred embodiment, made of two dielectric layers with an electrically conductive layer sandwiched therebetween. This three-layer construction is indicated by reference numeral 90 in FIG. 4. The electrically conductive portions include two electrically isolated portions so to provide a bipolar electrostatic chuck. The dielectric layers are preferably made from a polyimide film available from DuPont of Wilmington, Del. as Kaptone® KJ. The electrically conductive layer can be made of a variety of materials such as copper-surfaced cladply polyimide film, aluminum cladply polyimide film and aluminum-filled polyimide film available from Abelestik Laboratories, Rancho Dominguez, Calif. One preferred conductive layer is available from DuPont as Paralux® AP, an adhesiveless composite of polyimide film bonded to copper foil.

Electrostatic power lines 74 pass through holes 89 formed through support plate 61 and through holes 91 formed through plate 62 and are connected to a pair of electric contacts 92 (only one shown in the figures) mounted within a pair of recesses 94 formed in body 39. Electrical contacts 92 are welded in recesses 94 to provide an effective gas seal between interior 6 and heater chamber 50.

FIG. 4 is an enlarged sectional view of portions of body 39 of wafer support 36, circumferential barrier support 38 and base 32. The size and configuration of circumferential barrier support 38 provides a useful drop in temperature from body 39 to base end 42 of barrier support 38. In the preferred embodiment, circumferential barrier support 38 is sized and configured so that the temperature at base end 42 is about 50°–70° C. less than the temperature of wafer chucking surface 76 of body 39 of wafer support 36 to help keep the temperature of fluid seal 46 well within acceptable limits. The search for a design of barrier support 38 acceptable from a thermal standpoint is preferably achieved through the use of finite element analysis of structurally acceptable designs. Additional thermal resistance could also be achieved by, for example, modifying barrier support 38 so that it has vertically-extending ribs, by molding hollow ceramic spheres into the barrier support or by other conventional or unconventional methods.

To repair or replace wafer support 36, the user first uncouples the quick disconnect couplings 66A, 68A, 70A, 72A, 74A and 78A from their respective lines at a position beneath PVD chamber 2. Access to wafer support 36 within chamber housing 4 is then gained and bolts 48 are removed. Wafer support 36, with heater sub-assembly 54 mounted thereto, is then removed from base 32 of wafer heater assembly 30, with lines 66, 68, 70, 72, 74 and 78 and guide tube 64 extending from bottom member 65 of heater sub-assembly 54. Fluid seal 46 can be removed from circumferential groove 44 to permit the groove to be cleaned and a new fluid seal 46 to be mounted in the groove. What remains within PVD chamber interior 6 is base 32, support tube 34, bellows 52 and wafer lift assembly 16. After the appropriate repairs or replacements have been made, wafer support 36 with heater sub-assembly 54 mounted thereto and guide tube 64 extending therefrom, are replaced in PVD chamber housing 4 with guide tube 64 passing through support tube 34 and bellows 12 until base end 42 of circumferential barrier support 38 rests on base 32 and against fluid seal 46. Bolts 48 are then used to secure wafer support 36 to base 32. The various quick-disconnect connectors 66A, 68A, 70A, 72A, 74A, 78A are then used to reconnect lines 66, 68, 70, 72, 74, 78 to permit PVD chamber 2 to once again be placed in use.

Modification and variation can be made to the disclosed embodiment without departing from the subject of the invention as defined in the following claims. For example, the present invention has been described with reference to a PVD chamber using an electrostatic chuck. It can be used, however, with conventional clamp ring chucks and with other heated deposition chambers, such as CVD chambers and heated etch chambers, as well. The invention has been described with reference to wafers and wafer-supporting surfaces; as used in this application wafers is intended to cover not only silicon wafers but other substrates used in deposition and etch chambers as well.

What is claimed is:

1. A wafer heater assembly for a deposition/etch chamber comprising:

a base;

a wafer support comprising a wafer-chucking surface;

a circumferential barrier support having a wafer end at the wafer support and a base end at the base;

a heater sub-assembly thermally coupled to the wafer support;

a fluid seal positioned between the base end of the barrier support and the base; and a user-accessible attachment element securing the base to the wafer support with the barrier support therebetween thereby pressing the base end of the barrier support against the base with the fluid seal captured therebetween.

2. The assembly according to claim 1 wherein the barrier support is generally tubular, and wherein the base, the wafer support and the barrier support define a heater chamber and the heater sub-assembly is located within the heater chamber.

3. The assembly according to claim 1 wherein the heater sub-assembly is rigidly mounted to the wafer support using mechanical mounting elements.

4. The assembly according to claim 3 further comprising a heat distribution plate between the heater sub-assembly and the wafer support.

5. The assembly according to claim 3 wherein the base comprises an opening, and further comprising an electric conductor passing from the heater sub-assembly through the opening.

6. The assembly according to claim 1 wherein the chucking surface of the wafer support is an electrostatically chargeable surface.

7. The assembly according to claim 1 wherein the chucking surface is covered with electrically insulating material.

8. The assembly according to claim 1 wherein the barrier support includes means for restricting heat transfer from the wafer end to the base end thereby maintaining the temperature of the fluid seal substantially lower than the temperature of the wafer-chucking surface of the wafer support.

9. The assembly according to claim 1 wherein the fluid seal is an elastomeric o-ring.

10. The assembly according to claim 1 wherein the attachment element comprises a plurality of bolts.

11. The assembly according to claim 1 wherein the barrier support is an integral, one-piece extension of said wafer support.

12. A wafer heater assembly for a deposition/etch chamber comprising:

a base comprising an opening;

a wafer support comprising a wafer-chucking surface;

a circumferential barrier support having a wafer end at the wafer support and a base end at the base;

a heater sub-assembly mounted to the wafer support;

a guide tube, having an end, extending from the opening in the base away from the heater sub-assembly;

an electric conductor passing from the heater sub-assembly through the opening and through the guide tube;

a gas tube fluidly coupled to the wafer support and extending through the opening and through the guide tube;

quick-disconnected connectors for the gas tube and electric conductor external of the guide tube;

a fluid seal positioned between the base end of the barrier support and the base;

a user-accessible attachment element securing the base to the wafer support with the barrier support therebetween thereby pressing the base end of the barrier support against the base with the fluid seal captured therebetween; and barrier support including means for restricting heat transfer from the wafer end to the base end thereby maintaining the temperature of the fluid seal substantially lower than the temperature of the wafer-chucking surface of the wafer support to create a temperature drop between the wafer-chucking surface and the base end of the barrier support of at least about 50°–70° C. when the temperature of the wafer end of the barrier support is about 200°–300° C.

13. A wafer heater assembly for a deposition/etch chamber comprising:

a base comprising an opening;

a wafer support comprising a wafer-chucking surface;

a circumferential barrier support having a wafer end at the wafer support and a base end at the base;

a heater sub-assembly thermally coupled to the wafer support, the heater sub-assembly being rigidly mounted to the wafer support using mechanical mounting elements;

an electric conductor passing from the heater sub-assembly through the opening in the base;

a fluid seal positioned between the base end of the barrier support and the base; and an attachment element securing the base to the wafer support with the barrier support therebetween thereby pressing the base end of the barrier support against the base with the fluid seal captured therebetween.

14. The assembly according to claim 13 further comprising a guide tube extending from the opening in the base away from the heater sub-assembly, the electric conductor passing through the guide tube.

15. The assembly according to claim 14 further comprising a gas tube fluidly coupled to the wafer support and extending through the guide tube.

16. The assembly according to claim 15 wherein the guide tube has an end; and further comprising quick-disconnected connectors for the gas tube and electric conductor external of the guide tube.

17. The assembly according to claim 15 wherein the chucking surface is fluidly coupled to the gas tube.

18. A wafer heater assembly for a deposition/etch chamber comprising:

a base;

a wafer support comprising an electrostatically chargeable wafer-chucking surface;

a circumferential barrier support having a wafer end at the wafer support and a base end at the base;

a heater sub-assembly thermally coupled to the wafer support;

a fluid seal positioned between the base end of the barrier support and the base; and an attachment element securing the base to the wafer support with the barrier support therebetween thereby pressing the base end of the barrier support against the base with the fluid seal captured therebetween.

19. A wafer heater assembly for a deposition/etch chamber comprising:

a base;

a wafer support comprising a wafer-chucking surface;

a circumferential barrier support having a wafer end at the wafer support and a base end at the base;

a heater sub-assembly thermally coupled to the wafer support;

a fluid seal positioned between the base end of the barrier support and the base;

the barrier support comprising means for restricting heat transfer from the wafer end to the base end thereby maintaining the temperature of the fluid seal substantially lower than the temperature of the wafer-chucking surface of the wafer support; and an attachment element securing the base to the wafer support with the barrier support therebetween thereby pressing the base end of the barrier support against the base with the fluid seal captured therebetween.

20. The assembly according to claim 19 wherein the heat transfer restricting means creates a temperature drop between the wafer-chucking surface and the base end of the barrier support of at least about 50°–70° when the temperature of the wafer-chucking surface is about 200°–300° C.

21. A wafer heater assembly for a deposition/etch chamber comprising:

a base;

a wafer support comprising a wafer-chucking surface;

a circumferential barrier support having a wafer end at the wafer support and a base end at the base;

a heater sub-assembly thermally coupled to the wafer support;

a fluid seal positioned between the base end of the barrier support and the base; and an attachment element securing the base to the wafer support with the barrier support therebetween thereby pressing the base end of the barrier support against the base with the fluid seal captured therebetween.

* * * * *